(12) United States Patent
Nakazawa et al.

(10) Patent No.: US 9,466,562 B2
(45) Date of Patent: Oct. 11, 2016

(54) SEMICONDUCTOR CHIP HAVING PLURAL PENETRATION ELECTRODE PENETRATING THERETHROUGH

(71) Applicant: PS4 Luxco S.a.r.l., Luxembourg (LU)

(72) Inventors: Shigeyuki Nakazawa, Tokyo (JP); Toru Ishikawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 752 days.

(21) Appl. No.: 13/720,791

(22) Filed: Dec. 19, 2012

(65) Prior Publication Data

US 2013/0161827 A1    Jun. 27, 2013

(30) Foreign Application Priority Data

Dec. 22, 2011 (JP) .................................. 2011-281517

(51) Int. Cl.

| | |
|---|---|
| *H01L 23/522* | (2006.01) |
| *H01L 23/48* | (2006.01) |
| *H01L 25/065* | (2006.01) |
| *G11C 5/06* | (2006.01) |
| *G11C 29/02* | (2006.01) |
| *G11C 29/12* | (2006.01) |
| *H01L 21/66* | (2006.01) |
| *H01L 25/18* | (2006.01) |

(52) U.S. Cl.
CPC ........... *H01L 23/5226* (2013.01); *G11C 5/063* (2013.01); *G11C 29/025* (2013.01); *G11C 29/1201* (2013.01); *H01L 22/34* (2013.01); *H01L 23/481* (2013.01); *H01L 25/0657* (2013.01); *H01L 25/18* (2013.01); *H01L 2224/16* (2013.01); *H01L 2225/06513* (2013.01); *H01L 2225/06517* (2013.01); *H01L 2225/06544* (2013.01); *H01L 2225/06596* (2013.01)

(58) Field of Classification Search
CPC ............... H01L 22/34; H01L 25/0657; H01L 21/76898

See application file for complete search history.

(56) References Cited

U.S. PATENT DOCUMENTS

| | | | | |
|---|---|---|---|---|
| 7,700,944 | B2 * | 4/2010 | Nishizawa | 257/48 |
| 8,310,066 | B2 | 11/2012 | Sasaki | |
| 8,618,827 | B2 * | 12/2013 | Shao et al. | 324/762.05 |
| 8,659,152 | B2 * | 2/2014 | Fujita | 257/737 |
| 2006/0001144 | A1 * | 1/2006 | Uehling et al. | 257/690 |
| 2006/0189007 | A1 * | 8/2006 | Aoki et al. | 438/14 |
| 2007/0077666 | A1 * | 4/2007 | Sogawa | 438/14 |
| 2007/0257353 | A1 * | 11/2007 | Park | G01R 31/2884 257/690 |

(Continued)

FOREIGN PATENT DOCUMENTS

| | | |
|---|---|---|
| JP | 2006108231 | 4/2006 |
| JP | 2008096312 | 4/2008 |

(Continued)

*Primary Examiner* — Bradley K Smith
*Assistant Examiner* — David Goodwin
(74) *Attorney, Agent, or Firm* — Kunzler Law Group, PC

(57) ABSTRACT

Disclosed herein is a semiconductor chip that includes: a plurality of penetration electrodes each penetrating between main and back surfaces of the semiconductor chip, the penetration electrodes including a plurality of first penetration electrodes, a second penetration electrode and a third penetration electrode; and a wiring configured to intersect with a plurality of regions, each of the regions being defined as a region between corresponding two of the first penetration electrodes, one end of the wiring being coupled to the second penetration electrode, the other end of the wiring being coupled to the third penetration electrode.

20 Claims, 9 Drawing Sheets

(56) References Cited

U.S. PATENT DOCUMENTS

Figure 1:
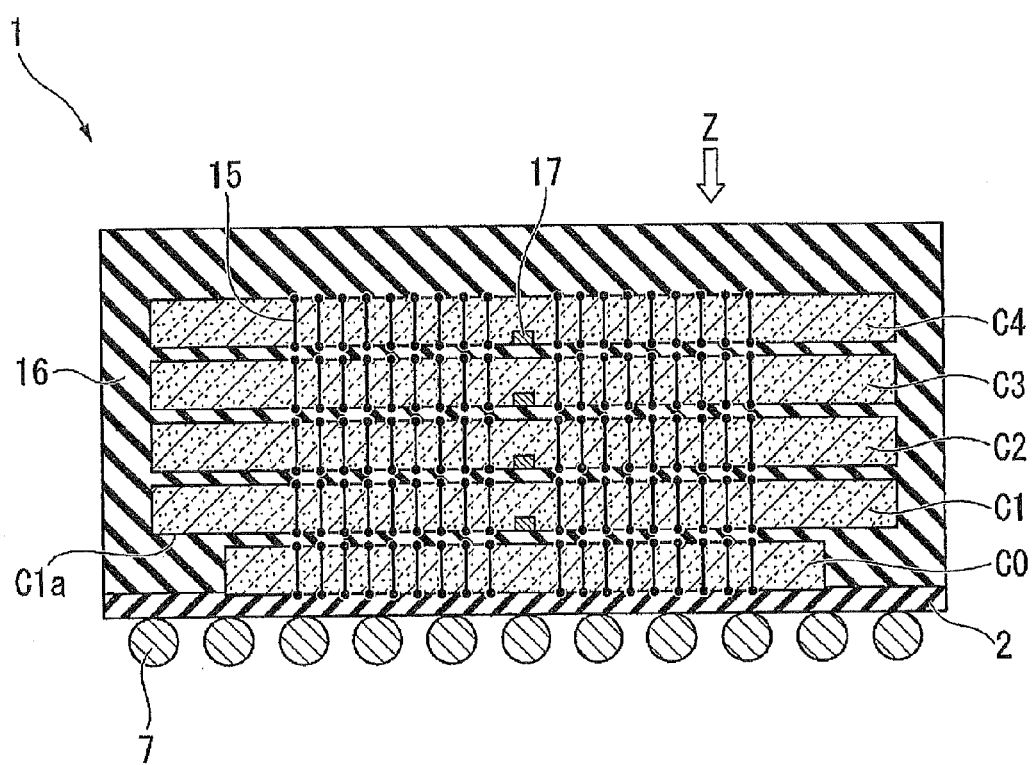

| | | |
|---|---|---|
| 2009/0057925 A1 | 3/2009 | Sasaki |
| 2009/0246892 A1* | 10/2009 | Maloney et al. ............ 438/15 |
| 2010/0171203 A1* | 7/2010 | Chen .............. H01L 23/481 257/686 |
| 2011/0031581 A1* | 2/2011 | West ....................... 257/508 |
| 2011/0084385 A1 | 4/2011 | Itaya et al. |
| 2011/0316123 A1* | 12/2011 | Sasaki et al. .............. 257/620 |
| 2012/0049884 A1* | 3/2012 | Kaltalioglu ............ 324/762.03 |
| 2013/0221353 A1* | 8/2013 | Yang et al. ................. 257/48 |
| 2013/0299947 A1* | 11/2013 | Uehling .................... 257/620 |
| 2014/0191410 A1* | 7/2014 | Leatherman et al. ....... 257/774 |
| 2015/0115993 A1* | 4/2015 | Wang et al. ........... 324/762.03 |

FOREIGN PATENT DOCUMENTS

| | | |
|---|---|---|
| JP | 2009-054862 A | 3/2009 |
| JP | 2011-082450 A | 4/2011 |

* cited by examiner

SEMICONDUCTOR CHIP HAVING PLURAL PENETRATION ELECTRODE PENETRATING THERETHROUGH

BACKGROUND OF THE INVENTION

1. Field of the Invention

The present invention relates to a semiconductor chip and a semiconductor device having the semiconductor chip.

2. Description of Related Art

In recent years, along with downsizing of electronic devices or the like having a semiconductor device incorporated therein, there has been a strong demand for downscaling of semiconductor devices. In connection to this demand, there has been a development of a semiconductor device in which a plurality of semiconductor chips are stacked and these semiconductor chips are connected by using through silicon vias. For example, Japanese Patent Application Laid-open No. 2011-82450 discloses a semiconductor device in which a plurality of semiconductor chips are connected by through silicon vias (TSVs) each penetrating a silicon semiconductor substrate.

In some of semiconductor devices in which a plurality of semiconductor chips are connected by through silicon vias, an area where a plurality of through silicon vias are arranged in an array manner is provided. Such an area is called as a through-silicon-via array area in the following explanation. The through-silicon-via array area includes an insulation layer or a wiring layer which has a possibility that cracks are generated therein at the time of stacking the semiconductor chips. Since such cracks can be a cause of a failure of the semiconductor device, it is necessary to detect the presence of cracks in the through-silicon-via array area before shipment of semiconductor devices as products.

As a technique of detecting cracks that are generated on semiconductor chips, there has been proposed a semiconductor device in which a wire for detecting cracks is arranged along the entire outer periphery of a semiconductor chip. Each ends of the wire is connected to a pad which an external tester is brought into contact with. According to the semiconductor device, it becomes possible to detect cracks generated on the semiconductor chips by detecting a variation of a resistance value between the pads (see, for example, Japanese Patent Application Laid-open No. 2009-54862).

However, what the method described in Japanese Patent Application Laid-open No. 2009-54862 can detect are only cracks generated on an outer periphery part of a semiconductor chip, that is, an edge part of the semiconductor chip, and the method cannot detect cracks generated at portions other than an outer periphery part of a semiconductor chip.

The above-mentioned through-silicon-via array area is occasionally formed on a position other than an outer periphery part of a semiconductor chip, such as a central part of the semiconductor chip. Therefore, there has been a demand of a technique of detecting cracks generated on a position other than an outer periphery part of the semiconductor chip in order to detect cracks generated on the through-silicon-via array area.

SUMMARY

In one embodiment, there is provided a semiconductor device that includes at least one semiconductor chip, the semiconductor chip including: a plurality of penetration electrodes each penetrating between main and back surfaces of the semiconductor chip, the penetration electrodes including a plurality of first penetration electrodes, a second penetration electrode and a third penetration electrode; and a wiring structure including at least one first wiring segment configured to intersect with a plurality of regions, each of the regions being defined as a region between corresponding two of the first penetration electrodes, one end of the first wiring segment being electrically coupled to the second penetration electrode, the other end of the first wiring segment being electrically coupled to the third penetration electrode such that an electrical current flows between the second and third penetration electrodes through the first wiring segment of the wiring structure.

In another embodiment, there is provided a semiconductor device that includes at least one semiconductor chip, the semiconductor chip including: a plurality of penetration electrodes each penetrating between main and back surfaces of the semiconductor chip, the penetration electrodes including a plurality of first penetration electrodes, a second penetration electrode and a third penetration electrode; and a wiring structure including a first terminal coupled to the second penetration electrode, a second terminal coupled to the third penetration electrode and a plurality of middle wirings coupled in series between the first and second terminals to make an electrical path between the second and third penetration electrodes, each of the middle wirings elongating such that each of the middle wirings threads its way through corresponding ones of the first penetration electrodes.

BRIEF DESCRIPTION OF THE DRAWINGS

FIG. 1 is a cross-sectional view of a semiconductor device according to a first embodiment of the present invention;

FIGS. 2A and 2B are schematic diagrams for explaining an electrical connection between a plurality of semiconductor chips in the semiconductor device shown in FIG. 1;

FIG. 3 is an explanatory diagram of an outline of the crack check control circuit that generates the crack check enable signal TE;

FIG. 4 is a plan view showing a semiconductor chip C1 included in the semiconductor device 1 shown in FIG. 1;

FIG. 5 is a cross-sectional view showing a part of the semiconductor chip shown in FIG. 4 in an enlarged manner;

FIG. 6 is a plan view showing a part of the semiconductor chip C1 shown in FIG. 4 in an enlarged manner;

FIG. 7 is an explanatory diagram of another example of the semiconductor chip according to the first embodiment of the present invention, and is a plan view showing a part of the semiconductor chip in an enlarged manner;

FIG. 8 is an explanatory diagram of the semiconductor chip according to a second embodiment of the present invention, and is a plan view showing of a part of the semiconductor chip in an enlarged manner; and FIG. 9 is an explanatory diagram of another example of the semiconductor chip according to the second embodiment of the present invention, and is a plan view showing of a part of the semiconductor chip in an enlarged manner.

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

A semiconductor chip and a semiconductor device according to the present invention will be explained below with reference to the drawings. The drawings used in the following explanations are for explaining configurations of embodiments of the present invention, and the size, thickness, and dimensions of respective elements shown in the drawings may be shown differently from an actual dimensional relationship between these elements. Furthermore, materials or the like exemplified in the following explanations are only examples. The present invention is not necessarily limited to these examples, and these examples can be modified as appropriate without changing the scope of the invention.

First Embodiment

As shown in FIG. 1, a semiconductor device 1 according to the first embodiment of the present invention includes a package substrate 2, a plurality of semiconductor chips C0, C1, C2, C3, and C4 stacked on a surface (one face) of the package substrate 2, an encapsulating resin 16 that is formed on the surface of the package substrate 2 and covers each of the semiconductor chips C0, C1, C2, C3, and C4, and a plurality of external terminals 7 formed on a rear face (the other face) of the package substrate 2. In the semiconductor device 1, the semiconductor chips C1 to C4 are stacked to be in a flip-chip mode, that is, the surface thereof faces the side of the package substrate 2.

As the package substrate 2, a circuit substrate made of resin in which a re-wiring layer is formed, such as an interposer, can be used. The external terminals 7 formed on the rear face of the package substrate 2 are electrically connected to the corresponding group of terminals of the semiconductor chips C0 to C4 stacked on the surface of the package substrate 2 via the re-wiring layer formed in the package substrate 2. As shown in FIG. 1A, the semiconductor chips C0 to C4 are electrically connected to each other via through silicon vias 15 (substrate penetrating electrodes) that penetrate each of the semiconductor chip C0 to C4 in a stacking direction of the semiconductor chips.

The semiconductor chip C0 that is arranged nearest to the package substrate 2 is a controller chip (System On Chip; SOC) that controls the semiconductor device 1. The semiconductor chips C1, C2, C3, and C4 stacked on the semiconductor chip C0 are memory chips including a DRAM for example. Each of the semiconductor chips C1 to C4 is greater in size than the semiconductor chip C0.

The semiconductor device 1 shown in FIG. 1 is a system in which the semiconductor chips C0 to C4 are integrally packaged. The semiconductor chips C1 to C4 among these semiconductor chips C0 to C4 are semiconductor devices as integrally packaged passive elements. Each of the semiconductor chips C1 to C4 performs communications with the semiconductor chip C0 under control of the semiconductor chip C0. The semiconductor chip C0 communicates with outside via the external terminal 7.

It is possible to configure that the semiconductor chips C1 to C4 communicate with each other under control of the semiconductor chip C0. For example, this configuration is useful for copying of data between the chips and for data processing between the chips that is related to data processing in the semiconductor chip C0. Furthermore, each of the semiconductor chips C1 to C4 can be connected with outside via the semiconductor chip C0 and the external terminal 7 under control of the semiconductor chip C0.

In the first embodiment, explanations have been made with an example of a stacked semiconductor device constituted by five semiconductor chips, that is, the semiconductor chip C0 and four semiconductor chips C1, C2, C3, and C4 stacked thereon. However, it suffices as far as the semiconductor device according to the present invention is a semiconductor device in which a plurality of semiconductor chips including the semiconductor chip according to the present invention are electrically connected to each other via through silicon vias, and the semiconductor device is not limited to the example shown in FIG. 1. For example, the number of semiconductor chips stacked on the semiconductor chip C0 can be one to less than four, or more than four.

Figure 2A:
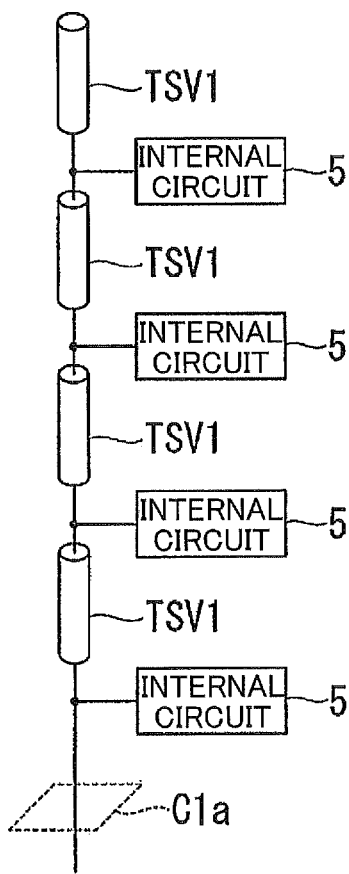
Figure 2B:
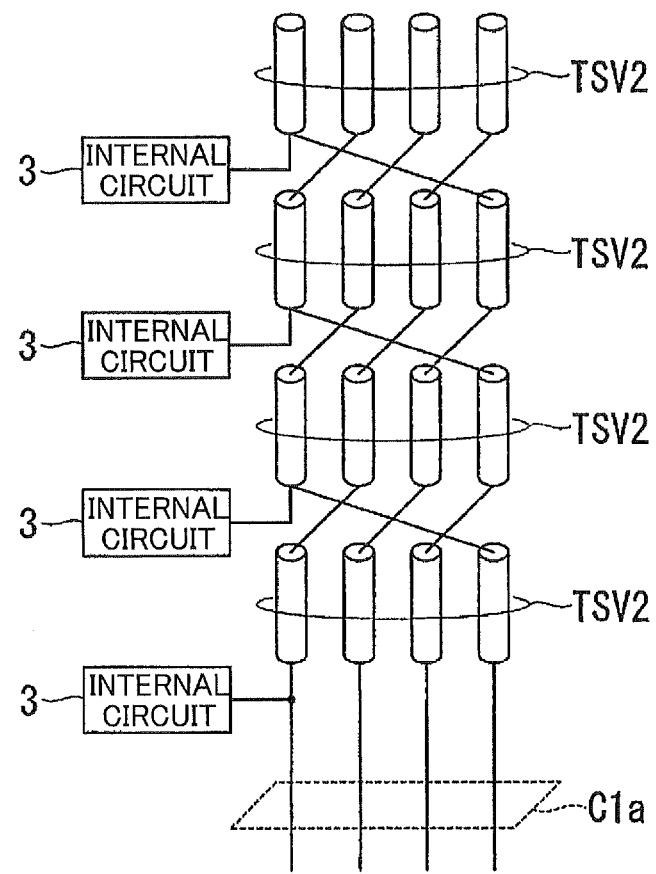

Electrical connection among the semiconductor chips C0, C1, C2, C3, and C4 in the semiconductor device 1 according to the first embodiment is explained next with reference to FIGS. 2A and 2B. FIGS. 2A and 2B are a schematic diagram showing through silicon vias TSV provided on the semiconductor chips C1 to C4, which are memory chips. As shown in FIGS. 2A and 2B, the semiconductor chip C0 (not shown in FIGS. 2A and 2B) as a controller chip is arranged on a lower layer of the semiconductor chip C1.

The through silicon via TSV1 shown in FIG. 2A is short-circuited with the through silicon via TSV1 on another layer provided at the same position in relation to the stacking direction, that is, when viewed in a direction of an arrow A shown in FIG. 1. That is, as shown in FIG. 2A, the through silicon vias TSV1 arranged one above the other at the same position are short-circuited with each other, and a single current path is formed by these through silicon vias TSV1. This current path is connected to an internal circuit 5 of each of the semiconductor chips C1 to C4.

Therefore, an input signal (a command signal, an address signal, a clock signal, and the like) supplied to the current path from outside via the bottom surface C1a of the semiconductor chip C1 is commonly input to the internal circuits 5 of the semiconductor chips C1 to C4. Furthermore, an output signal (data and the like) supplied to the current path from the internal circuit 5 of each of the semiconductor chips. C1 to C4 undergoes a wired-OR operation, and is output to outside from the bottom surface C1a of the semiconductor chip C1.

The through silicon via TSV2 shown in FIG. 2B is short-circuited with the through silicon via TSV2 on another layer provided at a different position. Specifically, in each of the semiconductor chips C1 to C4, four (that is, the number of layers) through silicon vias TSV2 are provided at the same positions. An internal circuit 3 of each of the semiconductor chips C1 to C4 is connected to a through silicon via TSV2 provided at a predetermined position from among the four through silicon vias TSV2 (in FIG. 2B, the through silicon via TSV2 at the leftmost side). The through silicon via TSV2 to which the internal circuit 3 is connected is short-circuited with the through silicon vias TSV2 on another layers provided at a different position for each layer, by which a current path penetrating the semiconductor chips C1 to C4 is formed. With this configuration, the current path is formed for each internal circuit 3, and a lower end of each current path is exposed to the bottom surface C1a. Therefore, via the current paths, it becomes possible to input information from outside selectively to the internal circuit 3 of each layer. A specific example of such information includes a chip select signal which are described later.

As described above, the through silicon vias 15 provided in the semiconductor chips C1 to C4 include two types of through silicon vias shown in FIGS. 2A and 2B (the through silicon via TSV1 and the through silicon via TSV2). The majority of the through silicon vias 15 are of the type shown in FIG. 2A, and an address signal, a command signal, a clock signal and the like are supplied from the semiconductor chip C0 to the semiconductor chips C1 to C4 via the through silicon via TSV1 of the type shown in FIG. 2A. Read data and write data are also input to and output from the semiconductor chip C0 via the through silicon via TSV1 of the type shown in FIG. 2A. Meanwhile, the through silicon via TSV2 of the type shown in FIG. 2B is used to transmit specific information to each of the semiconductor chips C1 to C4, which have mutually the same configuration.

Figure 3:
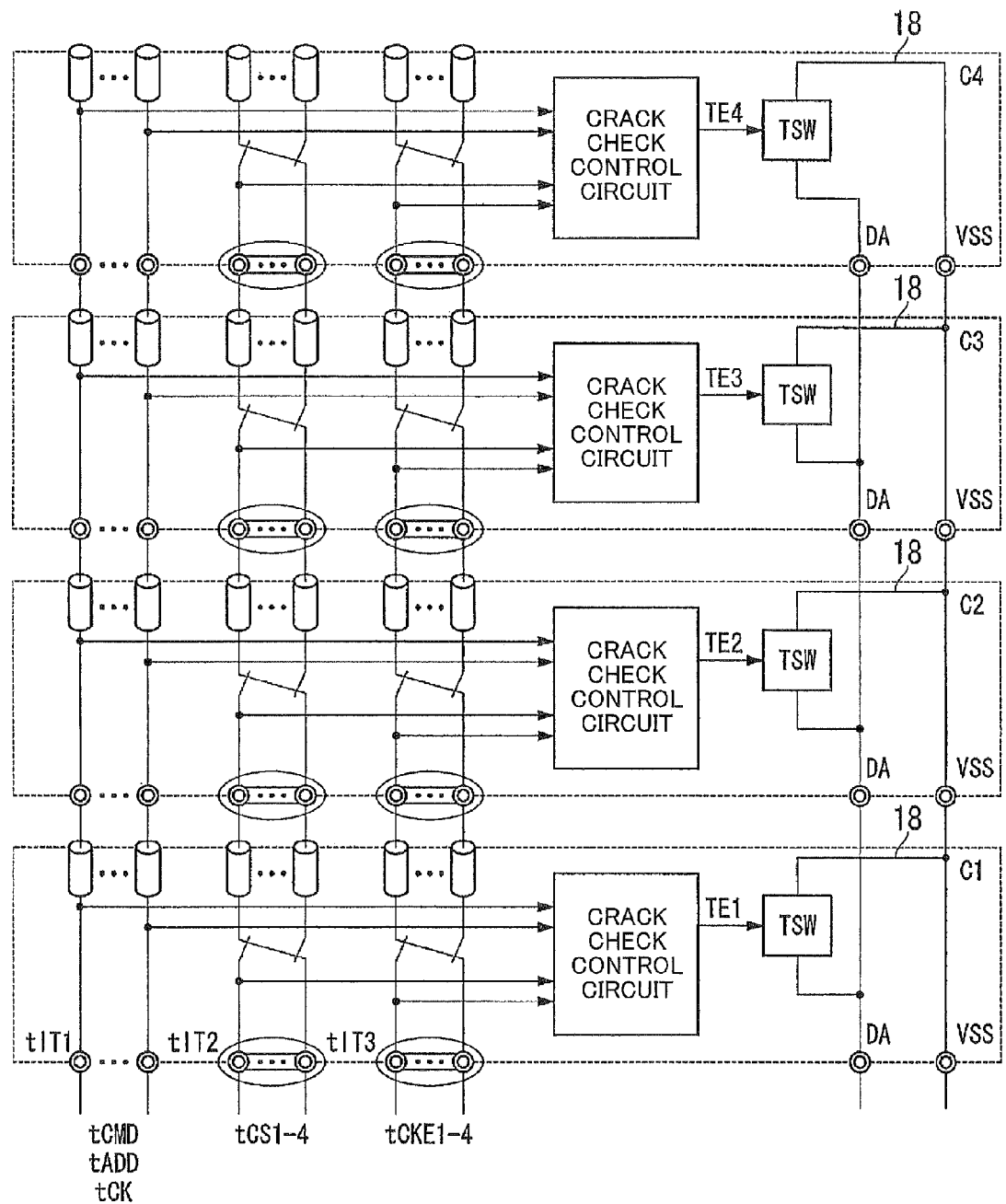

Next, an outline of a crack check control circuit, which generates a crack check enable signal TE used at the time of conducting an operation for detecting whether cracks are generated around the through silicon vias 15, is explained with reference to FIG. 3. FIG. 3 shows how crack check enable signals TE1 to TE4 corresponding to the respective semiconductor chips C1 to C4 are generated in a state where the semiconductor chips C1 to C4 as memory chips are stacked.

For the brevity of explanations, as signals input to each of the semiconductor chips, only a test command tCMD, a test address signal tADD, a test clock signal tCK, a test-chip select signal tCS1-tCS4, and a test-clock enable signal tCKE1-tCKE4, which are signals related to the crack check enable signal TE, are shown in FIG. 3. Other than these signals, various signals for controlling normal operations of the semiconductor chips are also supplied to the semiconductor chips. But explanations for such signals will be omitted.

As shown in FIG. 3, each of the semiconductor chips C1 to C4 includes a plurality of control-signal input terminals tIT1 that receive the test command tCMD, the test address signal tADD, and the test clock signal tCK. The plurality of control-signal input terminals tIT1 of the semiconductor chips C1 to C4 are connected to each other via the through silicon via TSV1 of the type shown in FIG. 2A. Therefore, each of the test command tCMD, the test address signal tADD, and the test clock signal tCK is commonly supplied to each of the semiconductor chips C1 to C4.

Furthermore, each of the semiconductor chips C1 to C4 includes a plurality of control-signal input terminals tIT2 that receive the test-chip select signal tCS1-tCS4. The control-signal input terminals tIT2 of the semiconductor chips C1 to C4 are connected to each other via the through silicon via TSV2 of the type shown in FIG. 2B. In each of the semiconductor chips, only one control-signal input terminal tIT2 among the control-signal input terminals tIT2 (the leftmost control-signal input terminal tIT2 in FIG. 3) is connected to the crack check control circuit which is formed in the semiconductor chip in which the control-signal input terminal tIT2 itself is formed. Thus, the test-chip select signal tCS1-tCS4 corresponds to the semiconductor chips C1 to C4, respectively, and to each of the semiconductor chips C1 to C4, the corresponding one of the test-chip select signal tCS1-tCS4 is individually supplied.

Each of the semiconductor chips C1 to C4 further includes a plurality of control-signal input terminals tIT3 that receive the test-clock enable signal tCKE1-tCKE4. The control-signal input terminals tIT3 of the semiconductor chips C1 to C4 are connected to each other via the through silicon via TSV2 of the type shown in FIG. 2B. In each of the semiconductor chips, only one control-signal input terminal tIT3 among the control-signal input terminals tIT3 (the leftmost control-signal input terminal tIT3 in FIG. 3) is connected to the crack check control circuit which is formed in the semiconductor chip in which the control-signal input terminal tIT3 itself is formed. Thus, the test-clock enable signal tCKE1-tCKE4 corresponds to the semiconductor chips C1 to C4, respectively, and to each of the semiconductor chips C1 to C4, the corresponding one of the test-clock enable signal tCKE1-tCKE4 is individually supplied.

The crack check enable signals TE1 to TE4 of the semiconductor chips C1 to C4 are configured to be selectively activated (supplied) only when the corresponding semiconductor chip is a check target. This configuration is realized by supplying the test command tCMD that indicates generation of the crack check enable signal TE, the test address signal tADD, and the test clock signal tCK in a state where the test-chip select signal tCS and the test-clock enable signal tCKE are selectively supplied to a semiconductor chip as a check target.

According to the semiconductor device 1 of the first embodiment, because the crack check enable signal TE can be selectively supplied to a semiconductor chip as a check target, it is possible to conduct a check only on the semiconductor chip as a check target even if the test terminals (first terminals), each of which is an end of a crack check wire 18 (details thereof will be described later) provided in each of the plurality of semiconductor chips, is connected each other, that is, the test terminals are connected to each other by the through silicon via TSV1 of the type shown in FIG. 2A.

In a state where only the semiconductor chips C1 to C4 as memory chips are stacked, the test command tCMD, the test address signal tADD, the test clock signal tCK, the test-chip select signal tCS, and the test-clock enable signal tCKE can be supplied from a predetermined testing pad provided on the semiconductor chip C1.

Furthermore, in a state where the semiconductor chips C1 to C4 and the semiconductor chip C0 as a controller chip are stacked, the test command tCMD, the test address signal tADD, the test clock signal tCK, the test-chip select signal tCS, and the test-clock enable signal tCKE can be supplied from the external terminal 7 via the semiconductor chip C0. In this case, it is possible to supply the test command tCMD, the test address signal tADD, the test clock signal tCK, the test-chip select signal tCS, and the test-clock enable signal tCKE to the semiconductor chips C1 to C4 as memory chips after performing predetermined arithmetic processing on a signal supplied from outside on the semiconductor chip C0. Alternatively, it is possible to supply the semiconductor chips C1 to C4 with signals supplied from outside directly, as the test command tCMD, the test address signal tADD, the test clock signal tCK, the test-chip select signal tCS, and the test-clock enable signal tCKE.

Incidentally, although explanations are made with an example of a case of using a crack check switch TSW (described later) in the first embodiment, it is also possible to configure such that test terminals of the semiconductor chips C1 to C4 as memory chips are connected to each other by a through silicon via TSV2 of the type shown in FIG. 2B, instead of providing the crack check switch TSW. In this case, by selecting an appropriate one among these test terminals, it becomes possible to conduct a check on the semiconductor chips C1 to C4 as memory chips serving as check targets.

Next, the semiconductor chip C1 as a memory chip included in the semiconductor device shown in FIG. 1 is explained. In the first embodiment, only the semiconductor chip C1 is explained because the semiconductor chips C1 to C4 have mutually the same configuration.

Figure 4:
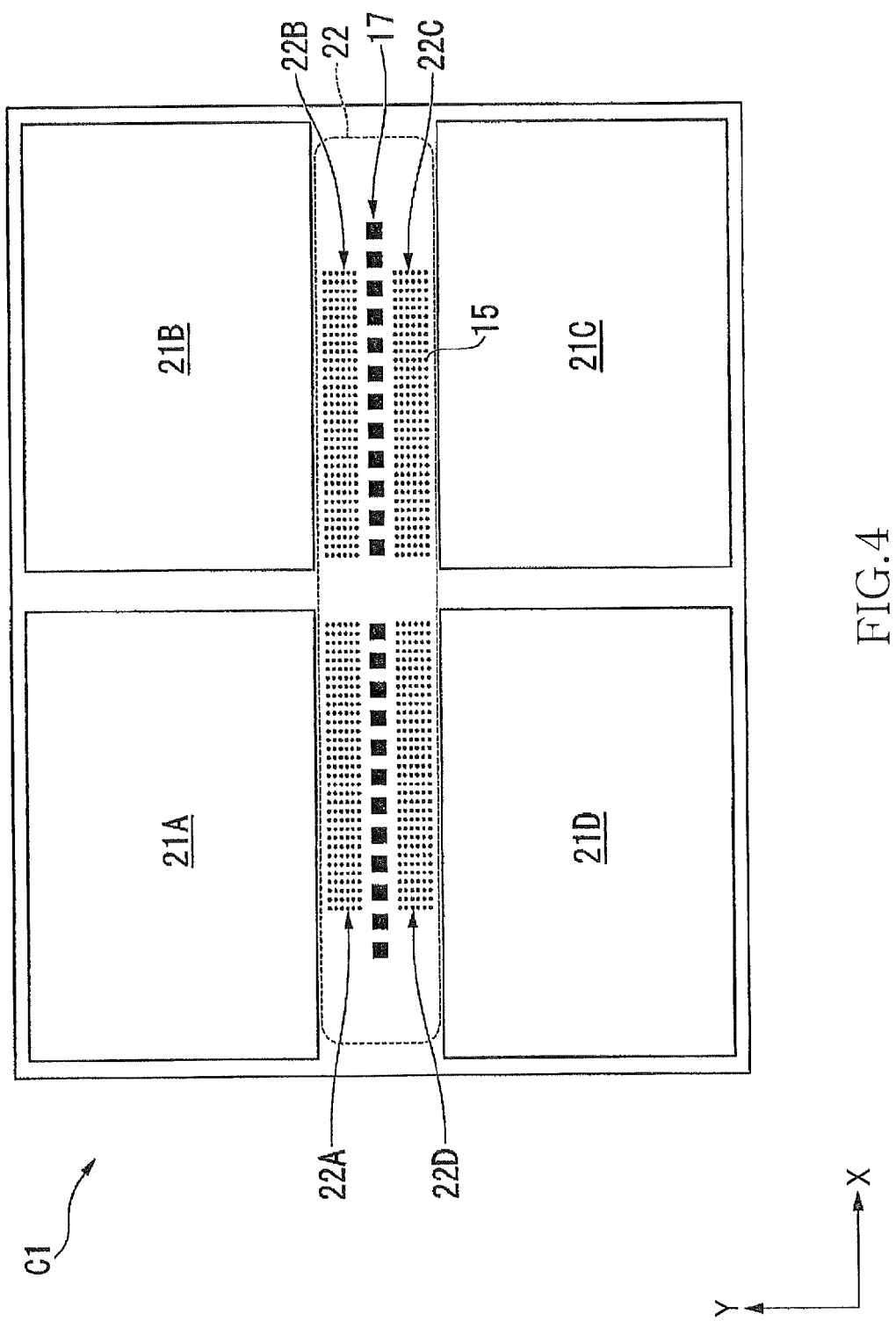
Figure 6:
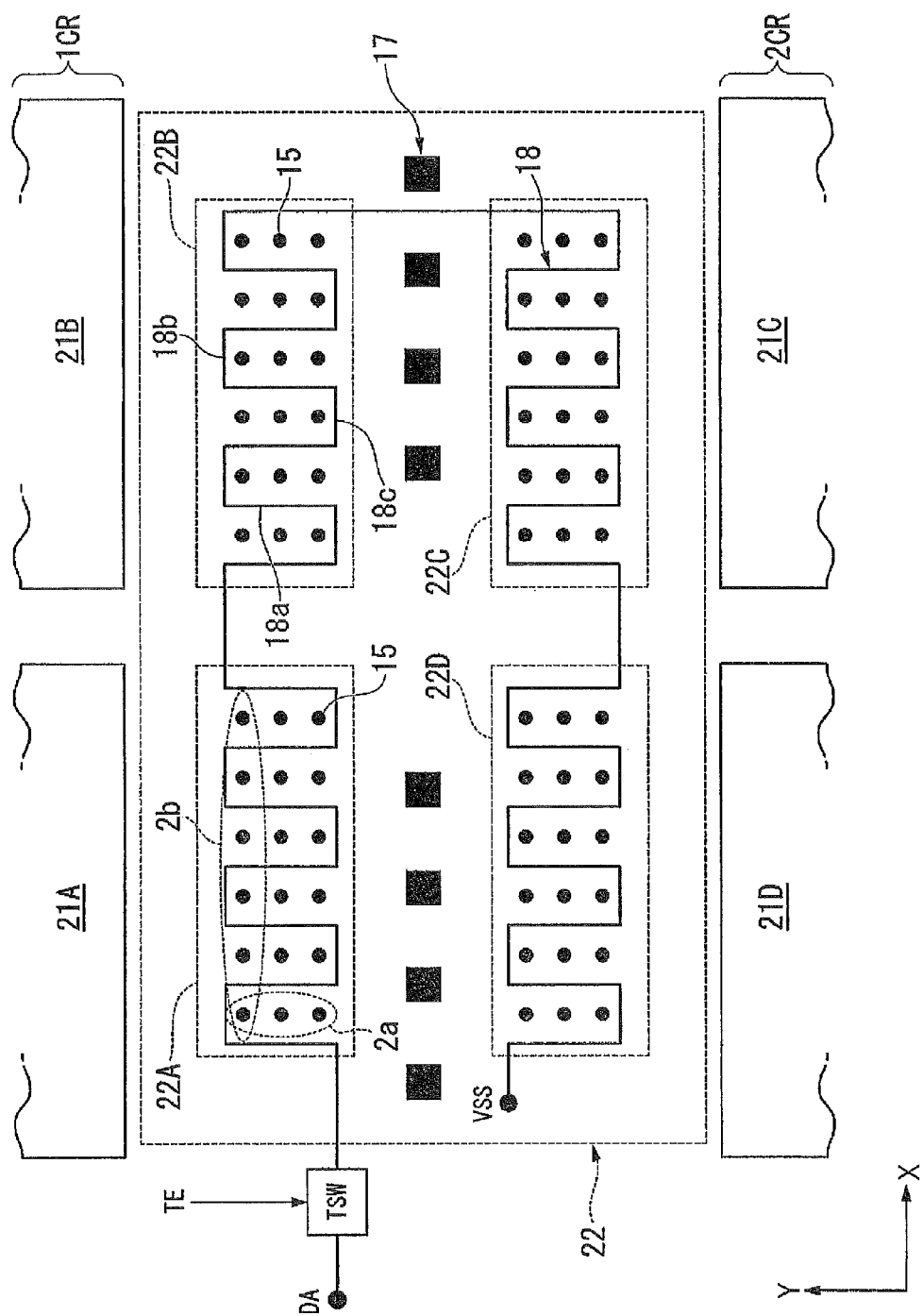

In FIG. 6, for the brevity of explanations, the number of through silicon vias in each of through silicon via arrays and the number of testing pads are shown less than those in FIG. 4. Furthermore, in FIG. 4, illustration of crack check wires is omitted to facilitate understanding of the drawing.

The semiconductor chip C1 has a configuration of a so-called "wide IODRAM". As shown in FIG. 4, the semiconductor chip C1 includes a plurality (four in the example of FIG. 4) of DRAMs (Dynamic Random Access Memories) including a volatile storage function. Specifically, as shown in FIG. 4, the semiconductor chip C1 includes channels 21A to 21D each serving as a DRAM and through silicon via groups 22A to 22D corresponding to the channels 21A to 21D, respectively. Each of the channels 21A to 21D includes both memory cell arrays forming a storage area of a DRAM and a control circuit that controls an access to the memory cell array. On the semiconductor chip C1 shown in FIG. 4, the four channels 21A to 21D are arranged on four corners of the rectangular semiconductor chip C1.

As shown in FIGS. 4 and 6, the through silicon via groups 22A to 22D is arranged in a through-silicon-via array area 22 which is arranged to be sandwiched between the channels 21A, 21B and the channels 21D, 21C, which are adjacent to each other in a Y direction. In each of the through silicon via groups 22A to 22D, a plurality of through silicon vias 15 that penetrate the semiconductor chip C1 in a vertical direction are arranged as shown in FIG. 6.

In the first embodiment, the plurality of through silicon vias 15 provided on the semiconductor chip C1 include a plurality of through silicon vias as data terminals that transmit and receive data Data to and from outside of the semiconductor chip C1, a plurality of through silicon vias as normal control signal terminals that transmit and receive a command CMD, an address signal ADD, a clock signal CK, a chip select signal CS, and a clock enable signal CKE to and from outside of the semiconductor chip C1, a plurality of through silicon vias as power-supply terminals to which power-supply voltages VDD and VSS and the like are supplied, and a plurality of through silicon vias as test terminals that transmit and receive the test command tCMD, the test address signal tADD, the test clock signal tCK, the test-chip select signal tCS1-4, and the test-clock enable signal tCKE1-4, which are control signals for testing.

Among the through silicon vias mentioned above, the through silicon vias as data terminals and the through silicon vias as normal control signal terminals are provided for each of the channels 21A to 21D individually. Meanwhile, the through silicon vias as power-supply terminals and the through silicon vias as test terminals are provided commonly to the channels 21A to 21D. Furthermore, the semiconductor chip C1 includes a through silicon via as a check terminal DA (described later). It is possible to configure such that this through silicon via as the check terminal DA is formed not to be included in any one of the through silicon via groups 22A to 22D, or formed to be included in any one of the through silicon via groups 22A to 22D.

Various operations such as a read operation, a write operation, and a refresh operation can be controlled by a control circuit on the semiconductor chip C0 as a controller chip individually for each of the channels 21A to 21D shown in FIG. 4. Incidentally, while a chip configuration of a wide IO DRAM shown in FIG. 4 has been explained as an example of a semiconductor chip in the first embodiment, the present invention is not limited to the example shown in FIG. 4.

In an area between the through silicon via groups 22A and 22D and between the through silicon via groups 22B and 22C, that is, in a central area of the through-silicon-via array area 22, a plurality of testing pads 17 are arranged linearly in an X direction (first direction) shown in FIG. 4. The testing pads 17 are pads (terminals) for connecting a probe needle when the semiconductor chip C1 is tested in a wafer state (wafer test). The pad size and gap (pitch) of the testing pads 17 respectively have a size for facilitating connection of the probe needle to the testing pads 17. Furthermore, because the wafer test on the semiconductor chip C1 is conducted using the testing pads 17, damaging the through silicon vias 15 during the wafer test can be avoided.

Next, a cross-sectional configuration of the semiconductor chip C1 is explained with reference to FIG. 5. Only an area where two of the plurality of through silicon vias 15 in the through-silicon-via array area 22 are formed and the periphery of the area are shown in FIG. 5.

Figure 5:
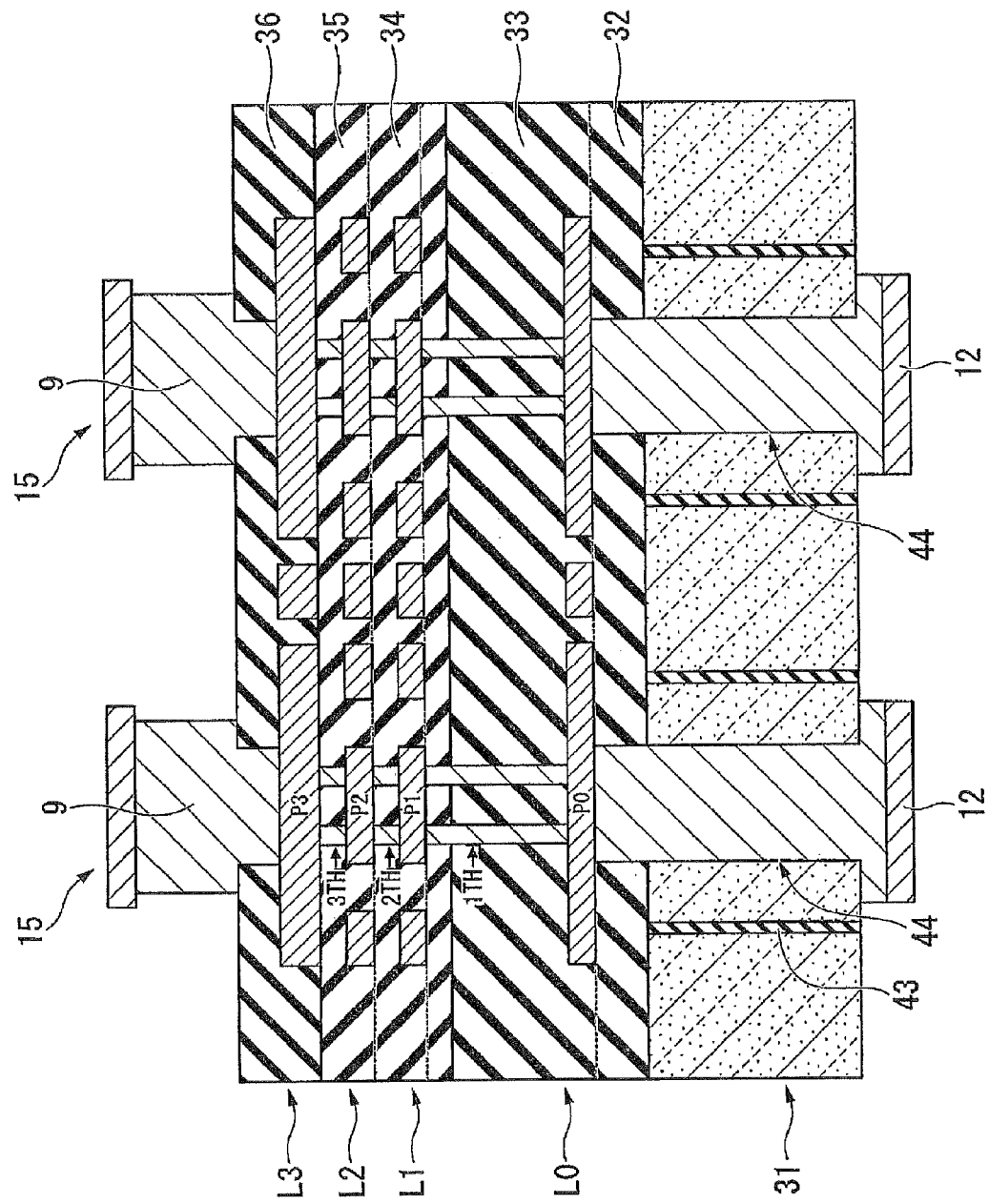

As shown in FIG. 5, the semiconductor chip C1 includes a semiconductor substrate 31, four wiring layers L0 to L3 and five interlayer dielectric films 32 to 36 that constitute a multilayer wiring layer (a multi-level wiring structure) formed on a surface (one face) of the semiconductor substrate 31, a plurality of surface bump electrodes 9, a plurality of rear-face bump electrodes 12, a plurality of substrate penetrating conductors (penetration plug) 44, and an insulating ring 43 formed in the semiconductor substrate 31. Furthermore, although not shown in FIG. 3, various circuit elements that perform substantial functions of the semiconductor chip C1 are formed on the semiconductor substrate 31 and in the interlayer dielectric films 32 and 33.

As shown in FIG. 5, the interlayer dielectric film 32 is provided on the surface (one face) of the semiconductor substrate 31, and the wiring layer L0 having a predetermined pattern is formed on the interlayer dielectric film 32. Furthermore, the interlayer dielectric film 33 is provided on the interlayer dielectric film 32 so as to cover the wiring layer L0, and the wiring layer L1 having a predetermined pattern is formed on the interlayer dielectric film 33. Similarly, the interlayer dielectric film 34 is provided on the interlayer dielectric film 33 so as to cover the wiring layer L1, the wiring layer L2 having a predetermined pattern is formed on the interlayer dielectric film 34, the interlayer dielectric film 35 is provided to cover the wiring layer L2, the wiring layer L3 having a predetermined pattern is formed on the interlayer dielectric film 35, and the interlayer dielectric film 36 is formed to cover the wiring layer L3.

Each of the wiring layers L0 to L3 having a multilayer wiring structure is configured such that the resistance on a wiring layer at the lower-layer side is equal to or higher than that on a wiring layer on the upper-layer side. In other words, the resistance value of each of the wiring layers L0 to L3 is set to be equal to or less than resistance values of one or more wiring layers at a farther side from the semiconductor substrate 31 than the corresponding layer. As an example, in the first embodiment, the wiring layer L0 on the lowermost layer is made of tungsten W, the wiring layers L1 to L3 are made of aluminum Al, and the thickness of the wiring layer L3 on the uppermost layer is made thicker than those of the wiring layers L1 and L2, so that the resistance of the wiring layer L3 becomes low. Accordingly, as for the resistance values of the wiring layers L0 to L3, a relationship of L0>L1≥L2>L3 is established. However, interrelationships among the resistance values of the respective layers having a multilayer wiring structure are not limited to that mentioned above.

The wiring layers L0 to L3 constitutes various wires such as a signal wire and a power-supply wire. Specifically, pads P0 to P3 connected to through-hole electrodes 1TH to 3TH shown in FIG. 5 and wires such as the crack check wire 18 (not shown in FIG. 4) shown in FIG. 6 are formed as parts of the wiring layers L0 to L3. The crack check wire 18 is formed as a part of the wiring layers L0 to L3, which are formed between adjacent through silicon vias 15.

As shown in FIG. 5, the surface bump electrodes 9 penetrating the interlayer dielectric film 36 and electrically connected to the pad P3 that is formed on the wiring layer L3 are formed on the interlayer dielectric film 36. As shown in FIG. 5, the wiring layers L0 to L3 are electrically connected to each other by the through-hole electrodes 1TH to 3TH which are formed as they respectively penetrate the interlayer dielectric films 33 to 35 and connect the pads P0 to P3 in a vertical direction.

The substrate penetrating conductors 44 penetrate the semiconductor substrate 31 and the interlayer dielectric film 32 and are electrically connected to the wiring layer L0, and the rear-face bump electrodes 12 electrically connected to the substrate penetrating conductors 44 are exposed to the rear face (the other face) of the semiconductor substrate 31.

The surface bump electrodes 9 and the rear-face bump electrodes 12 function as terminals of the semiconductor chip C1.

Furthermore, the insulating ring 43 is formed in the semiconductor substrate 31 to surround each of the substrate penetrating conductors 44. The insulating ring 43 has a function of insulating each of the through silicon vias 15 from an area (a transistor area) in the semiconductor substrate 31 having various circuit elements formed thereon.

As shown in FIG. 5, each of the through silicon vias 15 includes the surface bump electrodes 9, the pads P0 to P3, the through-hole electrodes 1TH to 3TH, the substrate penetrating conductors 44, and the rear-face bump electrodes 12.

Next, a planar configuration in the through-silicon-via array area 22 is explained in detail with reference to FIG. 6. In each of the through silicon via groups 22A to 22D arranged in the through-silicon-via array area 22, penetrating conductor arrays 2a, in which a plurality (three in FIG. 6) of through silicon vias 15 are arranged in juxtaposition in a Y direction (second direction), are arranged in plural (six in FIG. 6) in juxtaposition in an X direction (first direction) that is substantially orthogonal to the Y direction. That is, in the through silicon via groups 22A to 22D shown in FIG. 6, six through silicon vias 15 (denoted by reference character 2b in FIG. 6) are arranged in the X direction and three of those (the penetrating conductor arrays 2a) are arranged in the Y direction, where these through silicon vias 15 are arranged in an array manner in both directions. The number of the through silicon vias 15 arranged in the X direction and that of those arranged in the Y direction are not limited to those shown in FIG. 6.

As shown in FIG. 6, the size of the through silicon vias 15 arranged in the through silicon via groups 22A to 22D is set to be smaller than the size of the testing pads 17. Furthermore, a gap (pitch) between adjacent through silicon vias 15 is narrower than a gap (pitch) between adjacent testing pads 17.

In the first embodiment, as shown in FIG. 6, the crack check wire 18 is arranged in the through-silicon-via array area 22. Given that an area including the channels 21A and 21B that are arranged adjacently in a line in the X direction is designated as a first channel region 1CR and an area including the channels 21C and 21D that are arranged adjacently in a line in the X direction is designated as a second channel region 2CR, the through-silicon-via array area 22 is an area that is sandwiched by the first channel region 1CR and the second channel region 2CR in the Y direction. The crack check wire 18 connects the check terminal DA (first terminal) and a power-supply terminal VSS (second terminal) in response to a control signal. The crack check wire 18 is arranged to thread its way through adjacent through silicon vias 15. Furthermore, in the first embodiment, the crack check wire 18 is arranged to pass through adjacent penetrating conductor arrays 2a in all the through silicon via groups 22A to 22D in the through-silicon-via array area 22.

To be specific, as shown in FIG. 6, in each of the through silicon via groups 22A to 22D in the through-silicon-via array area 22, the crack check wire 18 includes a plurality of first parts (a plurality of first wiring segment) 18a extending in the Y direction along the penetrating conductor arrays 2a and a plurality of second parts (parts of a plurality of second wiring segment) 18b and a plurality of third parts (remaining parts of the plurality of second wiring segment) 18c each extending in the X direction along outer ends of the through silicon via groups 22A to 22D. A part of the first parts 18a is arranged to be sandwiched between adjacent penetrating conductor arrays 2a. The second parts 18b are arranged on a straight line extending in the X direction on a side of one end (the upper side in FIG. 6) of the penetrating conductor arrays 2a. The third parts 18c are arranged on a straight line extending in the X direction on a side of the other end (the lower side in FIG. 6) of the penetrating conductor arrays 2a.

As shown in FIG. 6, the second parts 18b and the third parts 18c are arranged having an offset in the Y direction, and both ends of each of the second parts 18b and of the third parts 18c are connected to an end of each of the first parts 18a. That is, one end (the upper side in FIG. 6) of the first parts 18a of the crack check wire 18 is connected to one of the other two first parts 18a adjoining in the X direction via the second parts 18b, and the other end (the lower side in FIG. 6) of the first parts 18a of the crack check wire 18 is connected to the other of the two adjoining first parts 18a via the third parts 18c.

In other words, in each of the through silicon via groups 22A to 22D in each of the through-silicon-via array areas 22, the crack check wire 18 is arranged in the following manner. That is, the crack check wire 18 extends in the Y direction along one of the penetrating conductor arrays 2a. The crack check wire 18 is then bent towards the X direction at a position where it has passed by a through silicon via 15 at one end of the one penetrating conductor array 2a. The crack check wire 18 is bent again towards the Y direction at a position where it has passed by this through silicon via 15 and extends in a direction the reverse of the Y direction along the one penetrating conductor array 2a. The crack check wire 18 is then bent again towards the X direction at a position where it has passed by a through silicon via 15 at another end of the one penetrating conductor array 2a, and then passes by another penetrating conductor array 2a which is adjacent to the one penetrating conductor array 2a.

It is preferable that the crack check wire 18 is formed as a part of the wiring layer L0 on the lowermost layer shown in FIG. 5. As described above, the resistance value of the wiring layer L0 on the lowermost layer is higher than those of other wiring layers L1 to L3. Therefore, normally, a wire having a long length for operating the semiconductor chip C1 is not arranged on the wiring layer L0 on the lowermost layer, and thus the crack check wire 18 having a long size can be easily arranged.

The crack check wire 18 is configured to form a conductive path that passes through the through silicon via group 22A, the through silicon via group 22B, the through silicon via group 22C, and the through silicon via group 22D in this order and electrically connects the check terminal DA (first terminal) and the power-supply terminal VSS (second terminal) when the crack check switch TSW is in a conductive state. The crack check switch TSW is a switch which enters in a conductive state when the crack check enable signal TE at an active level is supplied. The crack check switch TSW may include a transistor inserted in the crack check wire 18, for example.

In the semiconductor chip C1 according to the first embodiment, whether cracks are generated in the through-silicon-via array area 22 can be detected by a method described below, for example. That is, as shown in FIG. 6, in a state where a low-potential-side power supply voltage is applied to the power-supply terminal VSS connected to one end of the crack check wire 18 and the activated crack check enable signal TE is supplied to the crack check switch TSW, a high-potential-side power supply voltage is supplied to the check terminal DA at the other end of the crack check wire 18, thereby measuring whether a current flows into the check terminal DA.

When a current flows into the check terminal DA, because the crack check wire 18 is in a conductive state, it can be determined that cracks are not generated around the crack check wire 18. With regard to the semiconductor chip C1 according to the first embodiment, because the crack check wire 18 is arranged to pass through adjacent penetrating conductor arrays 2a in all the through silicon via groups 22A to 22D in the through-silicon-via array area 22, it can be determined that cracks are not generated in the through-silicon-via array area 22.

On the other hand, when any current does not flow into the check terminal DA, it can be determined that a part of the crack check wire 18 is disconnected due to the presence of cracks around the crack check wire 18. Therefore, it can be determined that cracks are generated in the through-silicon-via array area 22.

As described above, with regard to the semiconductor chip C1 according to the first embodiment, whether cracks are generated in the through-silicon-via array area 22 can be detected based on a conduction state between the check terminal DA and the power-supply terminal VSS when a control signal (voltage potential difference) is supplied between the check terminal DA and the power-supply terminal VSS via the crack check wire 18.

In the first embodiment, as shown in FIG. 6, explanations have been made with an example of a case where the crack check wire 18 is arranged in a bellows form such that it is arranged to thread its way through adjacent through silicon vias 15 in the Y direction. However, the present invention is not limited to the example shown in FIG. 6. For example, the crack check wire 18 can be arranged in a bellows form such that it is arranged to thread its way through adjacent through silicon vias 15 in the X direction, or can be arranged to pass through the through silicon vias 15 for every predetermined number, instead of passing through all adjacent through silicon vias 15.

Figure 7:
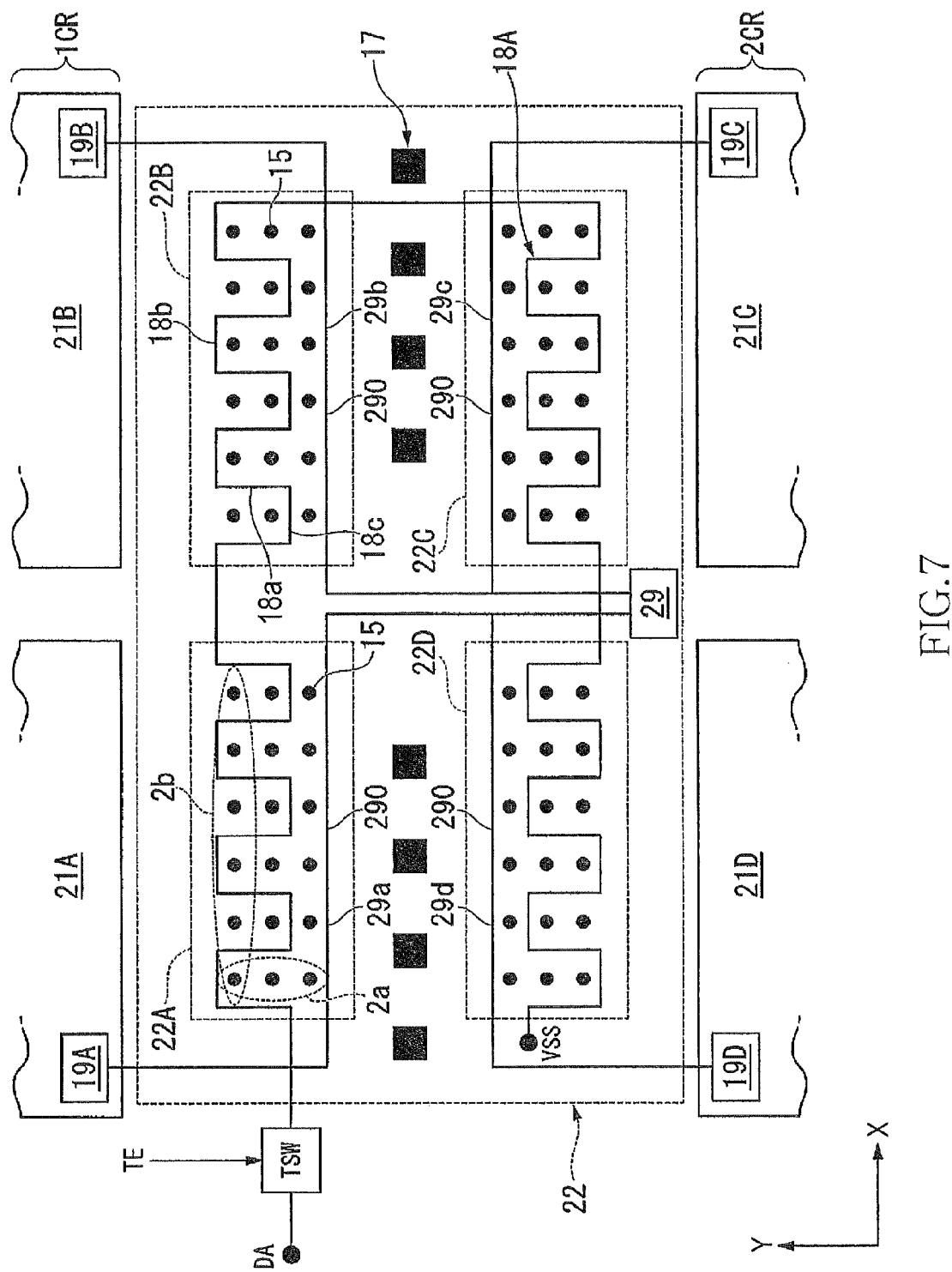

Turning to FIG. 7, the semiconductor chip according to an another example of the first embodiment of the present invention differs from the semiconductor chip shown in FIG. 6 only in the arrangement of a crack check wire 18A. Therefore, in the semiconductor chip shown in FIG. 7, elements identical to those of the semiconductor chip shown in FIG. 6 are denoted by like reference characters and redundant explanations thereof will be omitted.

In the semiconductor chip shown in FIG. 7, in order to explain a relationship between the arrangement of the crack check wire 18A and that of reference voltage wires 29a to 29d, a reference-voltage generation circuit 29, internal power-supply generation circuits 19A to 19D, and reference voltage wires 29a to 29d that electrically connect the reference-voltage generation circuit 29 and the internal power-supply generation circuits 19A to 19D are shown.

As shown in FIG. 7, the internal power-supply generation circuits 19A to 19D are provided in the respectively corresponding channels 21A to 21D. The reference-voltage generation circuit 29 generates a reference voltage Vref, and supplies the generated reference voltage Vref to each of the internal power-supply generation circuits 19A to 19D via the reference voltage wires 29a to 29d. Each of the internal power-supply generation circuits 19A to 19D generates various types of internal voltages in response to the reference voltage Vref.

The reference voltage Vref is a static signal and is input to each gate of the internal power-supply generation circuits 19A to 19D, and thus there is no electric charge consumption. Therefore, the reference-voltage generation circuit 29 that generates the reference voltage Vref has a small drive capability and an excessively large fan-out. Accordingly, the reference voltage Vref is considerably susceptible to the effect of noise from adjacent wires. Once the reference voltage Vref is superimposed by noise, the level of the reference voltage Vref fluctuates and it takes some time for the level to return to a normal level. Therefore, malfunctions may occur in the internal power-supply generation circuits 19A to 19D.

In the semiconductor chip shown in FIG. 7, each of the reference voltage wires 29a to 29d extending from the reference-voltage generation circuit 29 to each of the internal power-supply generation circuits 19A to 19D includes a through-silicon-via adjacent part 290 that is arranged in the X direction in a central area within the through-silicon-via array area 22. As shown in FIG. 7, the through-silicon-via adjacent part 290 is arranged between the through silicon via 15 of the through silicon via groups 22A and 22B and the testing pads 17, and between the through silicon via 15 of the through silicon via groups 22C and 22D and the testing pads 17. The reference voltage wires 29a to 29d shown in FIG. 7 are signal wires including a shielding wire that shields reference voltage wires.

The crack check wire 18A shown in FIG. 7 is different from the crack check wire 18 on the semiconductor chip shown in FIG. 6 in that a plurality of first parts 18a extending in the Y direction along with the penetrating conductor arrays 2a extend along only apart of the penetrating conductor arrays 2a, instead of extending from one end to the other end of the penetrating conductor arrays 2a. More specifically, the first parts 18a of the crack check wire 18A shown in FIG. 7 extend from a through silicon via 15 at the farthest end from the reference voltage wires 29a to 29d to the front of another through silicon via 15 at the nearest end from the reference voltage wires 29a to 29d.

In the semiconductor chip shown in FIG. 7, a gap between the through-silicon-via adjacent part 290 of the reference voltage wires 29a to 29d and the adjacent crack check wire 18A is set to be larger than a gap between adjacent through silicon vias 15. As a result, in the semiconductor chip shown in FIG. 7, it is possible to prevent the reference voltage Vref being affected by noise due to that the reference voltage Vref is adjacent to the crack check wire 18A. The gap between adjacent through silicon vias 15 is normally set to be approximately 50 μm.

Although explanations have been made with an example of a case where, in the semiconductor chip shown in FIG. 7, the internal power-supply generation circuits 19A to 19D are provided in the respectively corresponding channels 21A to 21D. However, the present invention is not limited thereto and, for example, a part of internal power-supply generation circuits can be shared by a plurality of channels, and a plurality of internal power-supply generation circuits can be provided in each channel.

Second Embodiment

Figure 8:
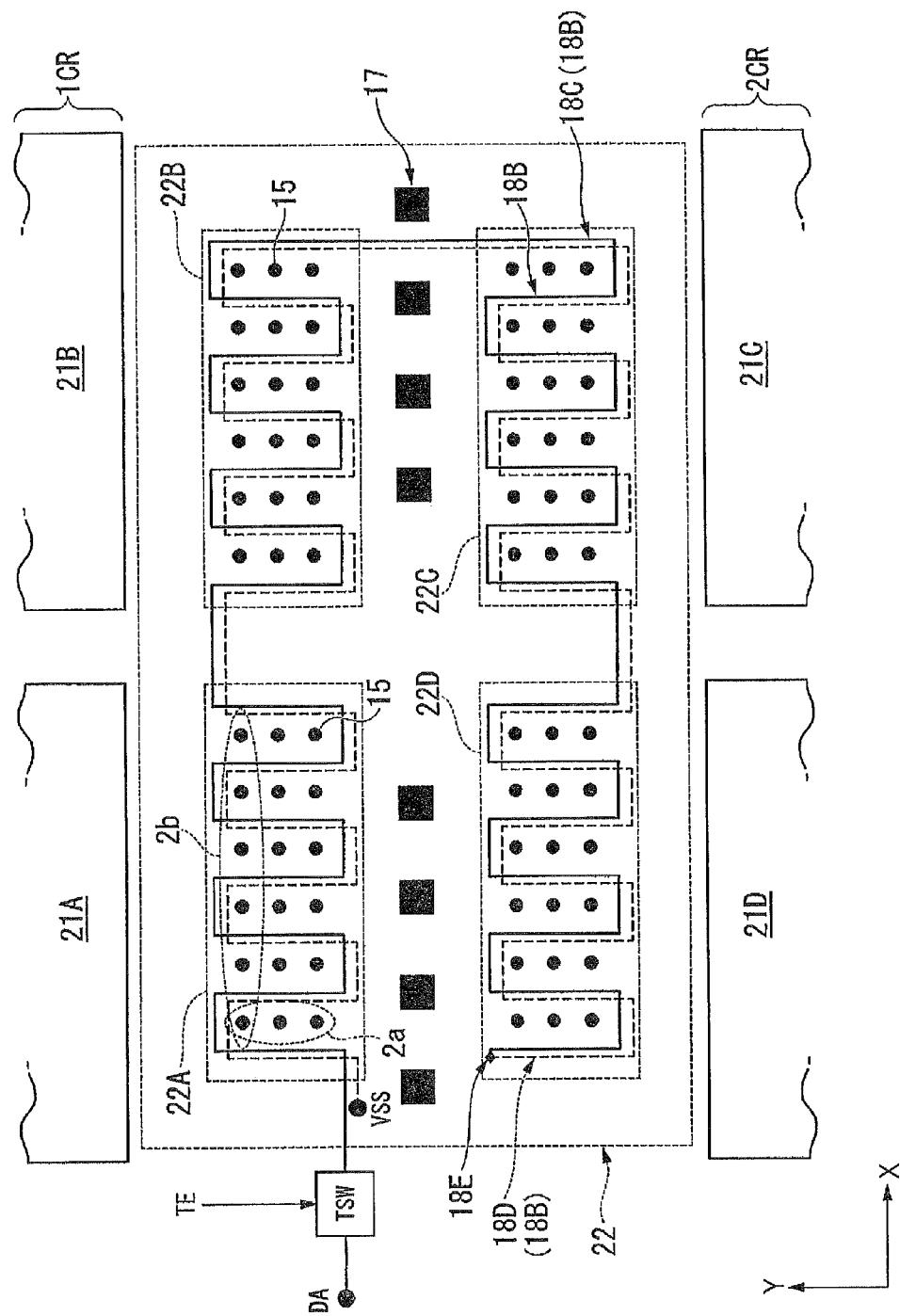

Turning to FIG. 8, the semiconductor chip according to the second embodiment of the present invention differs from the semiconductor chip shown in FIG. 6 only in the arrangement of a crack check wire 18B. Therefore, in the semiconductor chip shown in FIG. 8, elements identical to those of the semiconductor chip shown in FIG. 6 are denoted by like reference characters and redundant explanations thereof will be omitted.

In the first embodiment, forming the crack check wire 18 as a part of the wiring layer L0 on the lowermost layer is preferable in terms of that cracks generated on layers close to semiconductor substrates such as the interlayer dielectric films 32 and 33 and the wiring layer L0 shown in FIG. 5, which are caused by a pressure put on the substrate penetrating conductors 44 at the time of stacking semiconductor chips and the like, can be detected with high accuracy, for example.

However, depending to the behavior of generated cracks, forming the crack check wire 18 as a part of the wiring layer L0 on the lowermost layer may rather cause insufficient accuracy of detecting cracks. Such cracks are, for example, cracks generated only on a wiring layer on an upper-layer of a semiconductor chip and not reaching the lowermost layer of the wiring layer. More specific examples of such cracks include cracks generated around a solder-bonded part formed by solder-bonding the surface bump electrodes 9 of the semiconductor chip C1 and the rear-face bump electrodes of the semiconductor chip C2. Since this kind of cracks are formed away from the crack check wire 18, even if the cracks are generated, the disconnection of the crack check wire 18 may not occur. In that case, it is impossible to detect the crack using the crack check wire 18.

Meanwhile, forming the crack check wire 18 as a part of the wiring layer L3 on the uppermost layer in order to detect cracks generated on an upper-layer of a wiring layer of a semiconductor chip with high accuracy may cause that the accuracy of detecting cracks generated on a layer closer to a semiconductor substrate is not sufficient.

That is, in either case of forming the crack check wire 18 as a part of the wiring layer L3 on the uppermost layer or of the wiring layer L0 on the lowermost layer, there is a possibility that cracks cannot be detected with high accuracy.

On the other hand, according to the second embodiment, as shown in FIG. 8, the crack check wire 18B is configured to include a first crack check wire (a third wiring segment) 18C that is formed on one wiring layer selected from a plurality of layers, a second crack check wire (a fourth wiring segment) 18D that is formed on a wiring layer different from the wiring layer on which the first crack check wire 18C is formed, and a contact electrode 18E that electrically connects the first crack check wire 18C and the second crack check wire 18D.

That is, in the crack check wire 18B shown in FIG. 8, two crack check wire each having a shape substantially identical to that of the crack check wire 18 shown in FIG. 6 are formed on two wiring layers selected from a plurality of wiring layers, respectively, and the crack check wires are electrically connected in a vertical direction by the contract electrode 18E.

In the second embodiment, the first crack check wire 18C (shown by a solid line in FIG. 8) is formed on the wiring layer L0 on the lowermost layer (a wiring layer closest to a substrate among a plurality of wiring layers), and the second crack check wire 18D (shown by a broken line in FIG. 8) is formed on the wiring layer L3 on the uppermost layer (a wiring layer farthest from a substrate among a plurality of wiring layers). As shown in FIG. 8, the first crack check wire 18C and the second crack check wire 18D are overlapped with each other. Therefore, in the crack check wire 18B shown in FIG. 8, the extending length of the first crack check wire 18C and that of the second crack check wire 18D are set to be substantially the same. In FIG. 8, the position of the first crack check wire 18C and that of the second crack check wire 18D are shifted from each other to facilitate explanations of these wires.

Furthermore, in the crack check wire 18B shown in FIG. 8, the contact electrode 18E is provided only in one location. Therefore, in the crack check wire 18B shown in FIG. 8, the position where the contact electrode 18E is arranged is a turning position of the first crack check wire 18C and the second crack check wire 18D.

In the second embodiment, similarly to the first embodiment described above, the crack check wire 18B is configured to form a conductive path that passes through the through silicon via group 22A, the through silicon via group 22B, the through silicon via group 22C, and the through silicon via group 22D in this order and electrically connects the check terminal DA (first terminal) and the power-supply terminal VSS (second terminal) when the crack check switch TSW is in a conductive state.

Furthermore, similarly to the first embodiment described above, with regard to the semiconductor chip according to the second embodiment, whether cracks are generated in the through-silicon-via array area 22 can be detected based on a conduction state between the check terminal DA and the power-supply terminal VSS when a control signal (voltage potential difference) is supplied between the check terminal DA and the power-supply terminal VSS via the crack check wire 18B.

In the second embodiment, because the crack check wire 18B is configured to include the first crack check wire 18C that is formed on one wiring layer selected from a plurality of wiring layers, the second crack check wire 18D that is formed on a wiring layer different from the wiring layer on which the first crack check wire 18C is formed, and the contact electrode 18E that electrically connects the first crack check wire 18C and the second crack check wire 18D, cracks can be detected simultaneously on two wiring layers, which are a wiring layer on which the first crack check wire 18C is formed and a wiring layer on which the second crack check wire 18D is formed. As compared to a case where a crack check wire is formed on any one of the wiring layer L3 on the uppermost layer or the wiring layer L0 on the lowermost layer, in the second embodiment, the distance between cracks and the crack check wire 18B is closer regardless of where the cracks are generated, and therefore detection of cracks can be made with high accuracy.

In the second embodiment, the first crack check wire 18C is formed on the wiring layer L0 on the lowermost layer and the second crack check wire 18D is formed on the wiring layer L3 on the uppermost layer. Therefore, both cracks generated around the through silicon via 15 and cracks generated only on a wiring layer on an upper-layer of a semiconductor chip, such as cracks around the aforementioned solder-bonded part can be detected with high accuracy.

In the second embodiment, although explanations have been made with an example of a case where the first crack check wire 18C is formed on the wiring layer L0 on the lowermost layer and the second crack check wire 18D is formed on the wiring layer L3 on the uppermost layer, wiring layers on which the first crack check wire 18C and the second crack check wire 18D are formed can be any wiring layers as far as these crack check wires are formed on a different layer.

Figure 9:
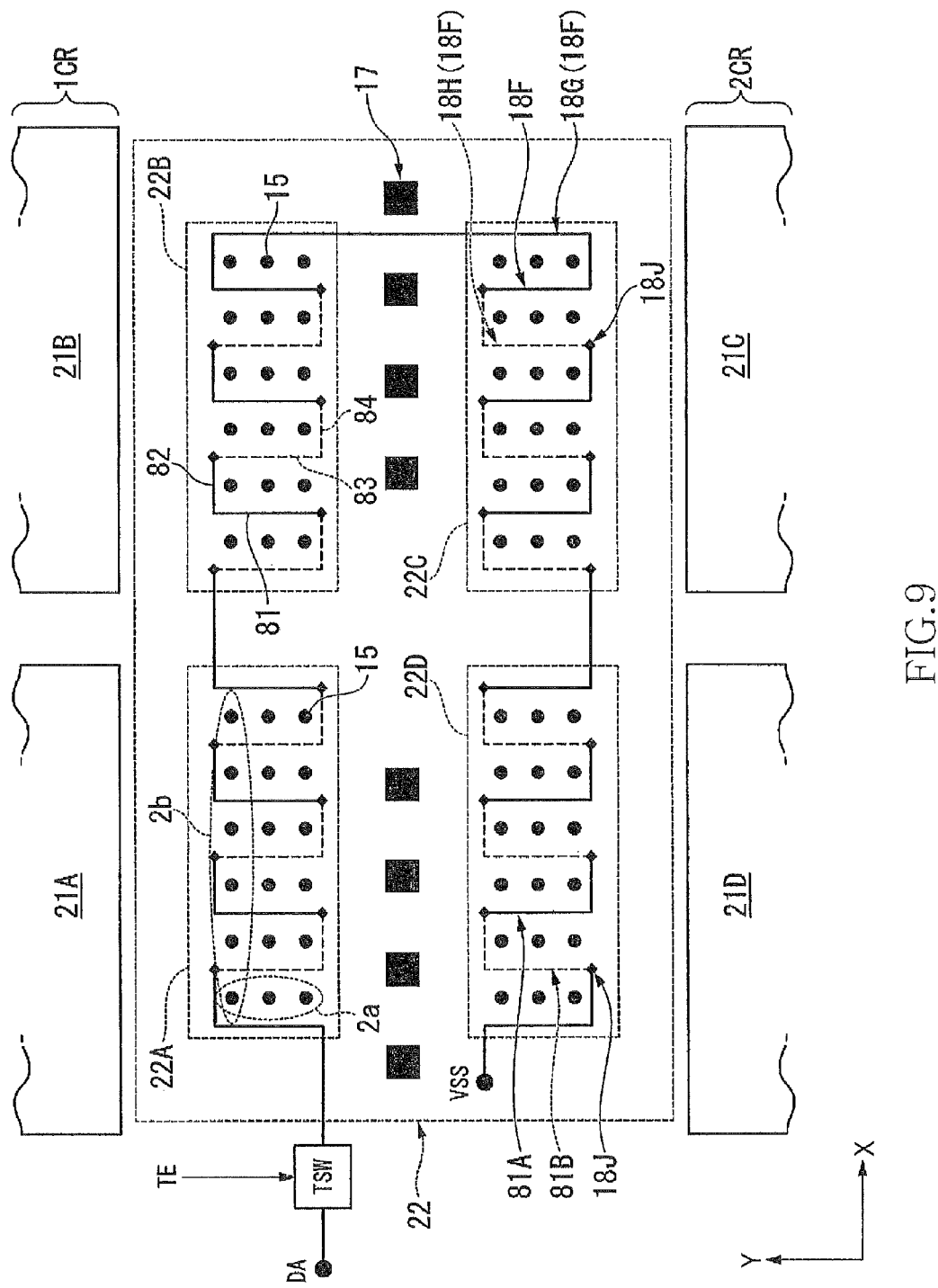

Turning to FIG. 9, the semiconductor chip according to an another example of the second embodiment of the present invention differs from the semiconductor chip shown in FIG. 8 only in the arrangement of a crack check wire 18F. Therefore, in the semiconductor chip shown in FIG. 9, elements identical to those of the semiconductor chip shown in FIG. 8 are denoted by like reference characters and redundant explanations thereof will be omitted.

Similarly to the crack check wire 18B shown in FIG. 8, the crack check wire 18F shown in FIG. 9 is configured to include a first crack check wire 18G that is formed on one wiring layer selected from a plurality of layers, a second crack check wire 18H that is formed on a wiring layer different from the wiring layer on which the first crack check wire 18G is formed, and a contact electrode 18J that electrically connects the first crack check wire 18G and the second crack check wire 18H.

However, the crack check wire 18F shown in FIG. 9 is different from the crack check wire 18B shown in FIG. 8 in that the first crack check wire 18G and the second crack check wire 18H are arranged in respectively different positions, and the contact electrode 18J that connects these crack check wires in a vertical direction is provided in plural. Furthermore, in the crack check wire 18F shown in FIG. 9, the penetrating conductor arrays 2a are arranged between the first crack check wire 18G and the second crack check wire 18H, and the contact electrodes 18J are arranged on an outer side with respect to the through silicon via 15 arranged on an end of the penetrating conductor arrays 2a.

More specifically, in the crack check wire 18F shown in FIG. 9, the first crack check wire 18G has a plurality of first L-shaped patterns 81A that are constituted by a first line 81 that is arranged between the penetrating conductor arrays 2a and a second line 82 that extends in the X direction from an end of the first line 81 located on one end side of the penetrating conductor arrays 2a with a length corresponding to a gap between adjacent penetrating conductor arrays 2a. Furthermore, in the crack check wire 18F shown in FIG. 9, the second crack check wire 18H has a plurality of second L-shaped patterns 81B that are constituted by a third line 83 that is arranged between the penetrating conductor arrays 2a and a fourth line 84 that extends from an end of the third line 83 located on the other end side of the penetrating conductor arrays 2a in the same direction of the second line 82 with a length corresponding to a gap between adjacent penetrating conductor arrays 2a. As shown in FIG. 9, the first L-shaped patterns 81A that are the first crack check wire 18G and the second L-shaped patterns 81B that are the second crack check wire 18H are arranged alternately, and are connected by the contact electrode 18J each other. Accordingly, similarly to the crack check wire 18B shown in FIG. 8, in the crack check wire 18F shown in FIG. 9, the extending length of the first crack check wire 18G and that of the second crack check wire 18H are set to be substantially the same.

Furthermore, similarly to the crack check wire 18B shown in FIG. 8, in the crack check wire 18F shown in FIG. 9, the first crack check wire 18G (shown by a solid line in FIG. 9) is formed on the wiring layer L0 on the lowermost layer, and the second crack check wire 18H (shown by a broken line in FIG. 9) is formed on the wiring layer L3 on the uppermost layer. Therefore, also in the crack check wire 18F shown in FIG. 9, both cracks generated around the through silicon via 15 and cracks generated only on a wiring layer on an upper-layer of a semiconductor chip, such as cracks around the aforementioned solder-bonded part, can be detected with high accuracy.

Furthermore, the extending length of the second crack check wire 18H which is formed on the wiring layer L3 on the uppermost layer is shorter than that of crack check wire 18B shown in FIG. 8, and thus an area for forming the second crack check wire 18H on the wiring layer L3 on the uppermost layer becomes smaller. The wiring layer L3 on the uppermost layer is a wiring layer used for mainly transmitting signals. Therefore, if the area for forming the second crack check wire 18H on the wiring layer L3 on the uppermost layer is large, an area where wires used for transmitting signals can be formed becomes narrow, and thus a plane area of a semiconductor chip may have to be increased in order to secure the area where wires used for transmitting signals are formed.

In the crack check wire 18F shown in FIG. 9, because the area for forming the second crack check wire 18H on the wiring layer L3 on the uppermost layer is small, it is suitable for downsizing a semiconductor chip.

Furthermore, cracks generated on a semiconductor chip often have a size larger than a gap between adjacent through silicon vias 15, which is normally approximately 50 μm. Therefore, in the crack check wire 18F shown in FIG. 9, although a gap between adjacent first crack check wires 18G and a gap between adjacent second crack check wires 18H are twice as wide as that between adjacent first crack check wires 18C and that between adjacent second crack check wires 18d, respectively, in the crack check wire 18B shown in FIG. 8, cracks can be detected with high accuracy.

Next, a modification of the first and second embodiments of the present invention is explained. In FIG. 1, a configuration in which the substrate penetrating conductors 44 and the rear-face bump electrodes 12 are formed on all the semiconductor chips C1 to C4 is shown. Meanwhile, a first modification has a configuration in which, while the substrate penetrating conductors 44 and the rear-face bump electrodes 12 are formed on the semiconductor chips C1 to C3, the substrate penetrating conductors 44 and the rear-face bump electrodes 12 are not formed on the semiconductor chip C4.

Because the semiconductor chip C4 is a semiconductor chip on the uppermost part of the semiconductor device 1, it suffices that the semiconductor chip C4 can take in signals and power supplied from the rear-face bump electrodes 12 on the semiconductor chip C3 via the surface bump electrodes 9 on the semiconductor chip C4, and it is not necessary to supply the signals supplied from the rear-face bump electrodes 12 on the semiconductor chip C3 to other semiconductor chips.

As described above, when the substrate penetrating conductors 44 and the rear-face bump electrodes 12 are not formed on the semiconductor chip C4, it is not necessary to have the semiconductor chip C4 made thin so as to facilitate the formation of the substrate penetrating conductors 44 and the rear-face bump electrodes 12, and thus the semiconductor chip C4 can be thicker than the semiconductor chips C1 to C3. As a result, it is possible to suppress deformation of chips due to thermal stress at the time of manufacturing the semiconductor device 1, specifically, at the time of stacking the semiconductor chips C1 to C4.

In FIG. 1, the semiconductor device 1 having four semiconductor chips C1 to C4 stacked therein has been explained as an example. However, the present invention can be also applied to other semiconductor devices such as those in which the number of stacked semiconductor chips is two or more. Even in such semiconductor chips not having four semiconductor chips stacked therein, the configuration described in the first modification can be applied. That is, as for such a semiconductor device, it is possible to apply a configuration in which the substrate penetrating conductors 44 and the rear-face bump electrodes 12 are not formed on a semiconductor chip stacked on the uppermost part in the semiconductor device, and the semiconductor chip stacked on the uppermost part is made thicker than other semiconductor chips stacked in the semiconductor device.

While not specifically claimed in the claim section, the applicant reserves the right to include in the claim section of the application at any appropriate time the following semiconductor chip and semiconductor devices:

A1. A semiconductor chip comprising:
a substrate;
a plurality of penetration electrodes penetrating the substrate, the penetration electrodes including first and second penetration electrodes provided in adjacent to each other;
a crack check wire connected between a first terminal and a second terminal, the crack check wire being arranged between the first and second penetration electrodes; and
a plurality of wiring layers including first and second wiring layers, wherein
the crack check wire includes:
a first crack check wire formed on the first wiring layer;
a second crack check wire formed on the second wiring layer; and
a contact electrode electrically connected between the first crack check wire and the second crack check wire,
the first crack check wire and the second crack check wire are arranged in respectively different positions,
the penetration electrodes are arranged in a predetermined direction between the first crack check wire and the second crack check wire such that a penetration electrodes array is formed, and
the contact electrode is arranged on an outer side with respect to the penetration electrodes array.

A2. A semiconductor device comprising a plurality of semiconductor chips, at least one of the semiconductor chips includes:
a substrate;
a plurality of penetration electrodes penetrating the substrate, the penetration electrodes including first and second penetration electrodes provided in adjacent to each other; and
a crack check wire connected between a first terminal and a second terminal, the crack check wire being arranged between the first and second penetration electrodes.

A3. A semiconductor device comprising:
an array area including a plurality of penetration electrodes; and
a crack check wire connected between a first terminal and a second terminal in response to a control signal,
wherein at least a part of the crack check wire is arranged in the array area.

A4. The semiconductor device as A3, further comprising a multilayer wiring structure that is formed in the array area, wherein
the multilayer wiring structure includes a first wiring layer and a second wiring layer that is formed on an upper-layer side of the first wiring layer, and
at least a part of the crack check wire includes a first part formed as the first wiring layer and a second part formed as the second wiring layer.

A5. The semiconductor device as A3, further comprising:
a first channel region including a first channel and a second channel each of which includes a storage area and a control circuit that controls an access to the storage area, the first and second channels being arranged in a first direction; and
a second channel region including a third channel and a fourth channel each of which includes a storage area and a control circuit that controls an access to the storage area, the third and fourth channels being arranged in the first direction, wherein
the first and second channel regions are arranged in a second direction that intersects with the first direction, and
the array area is arranged between the first channel region and the second channel region.

What is claimed is:
1. A semiconductor device comprising at least one semiconductor chip, the semiconductor chip comprising:
a plurality of penetration electrodes each penetrating between main and back surfaces of the semiconductor chip, the plurality of penetration electrodes including a plurality of first penetration electrodes, a second penetration electrode and a third penetration electrode; and
a wiring structure including at least one first wiring segment configured to intersect with a plurality of regions, each of the plurality of regions being defined as a region between a corresponding two of the first penetration electrodes, one end of the first wiring segment being electrically coupled to the second penetration electrode, the other end of the first wiring segment being electrically coupled to the third penetration electrode such that an electrical current flows between the second and third penetration electrodes through the first wiring segment of the wiring structure.

2. The semiconductor device as claimed in claim 1, wherein the semiconductor chip further comprises a switch circuit and the other end of the wiring structure is coupled to the third penetration electrode through the switch circuit.

3. The semiconductor device as claimed in claim 1, wherein the first penetration electrodes are arranged in matrix such that the plurality of regions are arranged in matrix.

4. The semiconductor device as claimed in claim 1, wherein the wiring structure further includes at least one second wiring segment, the first wiring segment elongating in a first direction and the second wiring segment elongating in a second direction perpendicular to the first direction.

5. The semiconductor device as claimed in claim 4, wherein the second wiring segment is configured not to intersect with any of the plurality of regions.

6. The semiconductor device as claimed in claim 4, wherein each of the first and second wiring segments is configured to intersect with at least a corresponding one of the plurality of regions.

7. The semiconductor device as claimed in claim 1, further comprising an additional semiconductor chip with which the semiconductor chip is stacked, the additional semiconductor chip including a plurality of additional penetration electrodes each electrically coupled to a corresponding one of the plurality of penetration electrodes of the semiconductor chip.

8. The semiconductor device as claimed in claim 7, wherein the semiconductor chip is greater in size than the additional semiconductor chip.

9. The semiconductor device as claimed in claim 1, wherein each of the penetration electrodes comprises:
   a penetration plug penetrating a semiconductor substrate of the semiconductor chip; and
   a multi-level wiring structure on the penetration plug, the multi-level wiring structure including a first pad as a lower level wiring coupled to the penetration plug and a second pad as an upper level wiring electrically coupled to the first pad;
   the first wiring segment of the wiring structure is formed as the upper level wiring.

10. The semiconductor device as claimed in claim 4, wherein each of the penetration electrodes comprises:
    a penetration plug penetrating a semiconductor substrate of the semiconductor chip; and
    a multi-level wiring structure on the penetration plug, the multi-level wiring structure including a first pad as a lower level wiring coupled to the penetration plug and a second pad as an upper level wiring electrically coupled to the first pad;
    the first wiring segment of the wiring structure being formed as the lower level wiring and the second wiring segment of the wiring structure being formed as the upper level wiring.

11. A semiconductor device comprising at least one semiconductor chip, the semiconductor chip comprising:
    a plurality of penetration electrodes each penetrating between main and back surfaces of the semiconductor chip, the plurality of penetration electrodes including a plurality of first penetration electrodes, a second penetration electrode and a third penetration electrode; and
    a wiring structure including a first terminal coupled to the second penetration electrode, a second terminal coupled to the third penetration electrode and a plurality of middle wirings coupled in series between the first and second terminals to make an electrical path between the second and third penetration electrodes, each of the middle wirings elongating such that each of the middle wirings threads its way through corresponding ones of the first penetration electrodes;
    wherein the semiconductor chip is divided into first and second regions respectively including a plurality of memory cells and a third region sandwiched between the first and second regions, the third region being free from the memory cells, both the plurality of penetration electrodes and the wiring structure being arranged in the third region.

12. The semiconductor device as claimed in claim 11, wherein the wiring structure comprises a single-level wiring structure and the middle wirings of the wiring structure are respectively formed as predetermined level wirings.

13. The semiconductor device as claimed in claim 12, wherein the middle wirings are directly connected in series to each other.

14. The semiconductor device as claimed in claim 11, wherein the wiring structure comprises a multi-level wiring structure, the middle wirings including one or more first middle wirings formed as lower level wirings and one or more second middle wirings formed as upper level wirings.

15. The semiconductor device as claimed in claim 14, wherein the wiring structure further comprises one or more through electrodes each connecting a corresponding one of the first middle wirings and a corresponding one of the second middle wirings.

16. The semiconductor device as claimed in claim 11, further comprising an additional semiconductor chip stacked with the semiconductor chip, the additional semiconductor chip comprising:
    a plurality of additional penetration electrodes each penetrating between main and back surfaces of the additional semiconductor chip, the plurality of additional penetration electrodes including a plurality of additional first penetration electrodes respectively electrically coupled to the first penetration electrodes, an additional second penetration electrode electrically coupled to the second penetration electrode and an additional third penetration electrode electrically coupled to the third penetration electrode; and
    an additional wiring structure including an additional first terminal coupled to the additional second penetration electrode, an additional second terminal coupled to the additional third penetration electrode and a plurality of additional middle wirings coupled in series between the additional first and additional second terminals to make an electrical path between the additional second and additional third penetration electrodes, each of the additional middle wirings elongating such that each of the additional middle wirings threads its way through corresponding ones of the additional first penetration electrodes.

17. The semiconductor device as claimed in claim 16, wherein the semiconductor chip further includes a switch circuit coupled between the first terminal of the wiring structure and the second penetration electrode, the additional semiconductor chip further including an additional switch circuit coupled between the additional first terminal of the additional wiring structure and the additional second penetration electrode, the switch circuit and the additional switch circuits being configured to be controlled independently.

18. The semiconductor device as claimed in claim 14, wherein the first middle wirings are substantially equal in length to one another and the second middle wirings are substantially equal in length to one another.

19. The semiconductor device as claimed in claim 17, wherein each of the switch circuit and the additional switch circuit is configured to be controlled to turn on in a test mode only.

20. The semiconductor device as claimed in claim 2, wherein the switch circuit is arranged between the other end of the wiring structure and the third penetration electrode.

* * * * *